United States Patent
Hsu et al.

(10) Patent No.: US 9,499,922 B2
(45) Date of Patent: Nov. 22, 2016

(54) MANUFACTURING METHOD OF DOUBLE CLADDING CRYSTAL FIBER

(71) Applicant: NATIONAL TAIWAN UNIVERSITY, Taipei (TW)

(72) Inventors: Kuang-Yu Hsu, Taipei (TW); Mu-Han Yang, Taipei (TW); Dong-Yo Jheng, Taipei (TW); Sheng-Lung Huang, Taipei (TW)

(73) Assignee: National Taiwan University, Taipei (TW)

(*) Notice: Subject to any disclaimer, the term of this patent is extended or adjusted under 35 U.S.C. 154(b) by 0 days.

(21) Appl. No.: 14/920,038

(22) Filed: Oct. 22, 2015

(65) Prior Publication Data
US 2016/0040316 A1    Feb. 11, 2016

Related U.S. Application Data

(62) Division of application No. 13/849,667, filed on Mar. 25, 2013, now Pat. No. 9,195,002.

(30) Foreign Application Priority Data

Sep. 14, 2012 (TW) .............. 101133840 A

(51) Int. Cl.
C30B 13/24 (2006.01)
G02B 6/036 (2006.01)
(Continued)

(52) U.S. Cl.
CPC .............. *C30B 13/24* (2013.01); *C30B 29/20* (2013.01); *C30B 29/28* (2013.01); *C30B 29/607* (2013.01); *C30B 29/62* (2013.01); *C30B 33/00* (2013.01); *G02B 1/02* (2013.01); *G02B 6/036* (2013.01);
(Continued)

(58) Field of Classification Search
CPC ....... C30B 13/24; C30B 29/20; C30B 29/62; C30B 33/00; G02B 6/0322; H01S 3/1636; H01S 3/1643
See application file for complete search history.

(56) References Cited

U.S. PATENT DOCUMENTS 3,253,896 A * 5/1966 Woodcock et al. .............. C03B 37/01214 156/166
3,877,912 A * 4/1975 Shiraishi .......... C03B 37/01211 385/126

(Continued)

OTHER PUBLICATIONS

Chia-Yao Lo, Kwang-Yao Huang, Jian-Cheng Chen, Shih-Yu Tu, and Sheng-Lung Huang, "Glass-clad Cr4+:YAG crystal fiber for the generation of superwideband amplified spontaneous emission," Opt. Lett. 29, 439-441 (2004).*

(Continued)

*Primary Examiner* — Peter Radkowski

(57) ABSTRACT

The present invention relates to a manufacturing method of a double cladding crystal fiber, in which growing an YAG or a sapphire into a single crystal fiber by LHPG method, placing the single crystal fiber into a glass capillary for inner cladding, placing the single crystal fiber together with the glass capillary for inner cladding into a glass capillary for outer cladding in unison, heating the glass capillary for inner cladding and outer cladding by the LHPG method to attach to the outside of the single crystal fiber, and thus growing into a double cladding crystal fiber. When the present invention is applied to high power laser, by using the cladding pumping scheme, the high power pumping laser is coupled to the inner cladding layer, so the problems of heat dissipation and the efficiency impairment due to energy transfer up-conversion of high power laser are mitigated.

14 Claims, 8 Drawing Sheets

(51) Int. Cl.
    *G02B 1/02* (2006.01)
    *C30B 29/20* (2006.01)
    *C30B 29/28* (2006.01)
    *C30B 29/60* (2006.01)
    *C30B 29/62* (2006.01)
    *C30B 33/00* (2006.01)
    *H01S 3/16* (2006.01)

(52) U.S. Cl.
    CPC ......... *G02B 6/03622* (2013.01); *H01S 3/1636* (2013.01); *H01S 3/1643* (2013.01)

(56) References Cited

U.S. PATENT DOCUMENTS

| | | | | |
|---|---|---|---|---|
| 4,289,516 A * | 9/1981 | Krohn | ................ | C03B 37/023 65/121 |
| 4,407,668 A * | 10/1983 | Aulich | ................ | G02B 6/02 65/145 |
| 4,961,768 A * | 10/1990 | Djeu | ................ | C03C 27/00 156/272.2 |
| 6,128,430 A * | 10/2000 | Chu | ................ | C03B 37/01205 385/141 |
| 6,389,198 B2 * | 5/2002 | Kafka | ................ | B82Y 20/00 385/31 |
| 7,139,458 B2 * | 11/2006 | Koh | ................ | C03C 13/046 385/127 |
| 7,266,259 B1 * | 9/2007 | Sumetsky | ................ | B82Y 20/00 359/341.1 |
| 7,306,376 B2 * | 12/2007 | Scerbak | ................ | G02B 6/4296 385/76 |
| 7,373,061 B2 * | 5/2008 | Hongo | ................ | G02B 6/02328 385/125 |
| 7,515,802 B2 * | 4/2009 | Peuchert | ................ | C03B 37/01211 385/127 |
| 7,630,415 B2 * | 12/2009 | Huang | ................ | H01S 3/0627 372/22 |
| 7,688,871 B2 * | 3/2010 | Kiriyama | ................ | H01S 3/0057 372/20 |
| 8,718,430 B2 * | 5/2014 | Chatigny | ................ | G02B 6/03611 385/126 |
| 9,195,002 B2 * | 11/2015 | Hsu | ................ | G02B 6/036 |
| 2002/0087047 A1 * | 7/2002 | Remijan | ................ | A61B 1/00142 600/109 |
| 2004/0252961 A1 * | 12/2004 | Peuchert | ................ | C03B 37/01211 385/141 |
| 2005/0158006 A1 * | 7/2005 | Koh | ................ | C03C 13/046 385/143 |
| 2006/0002433 A1 * | 1/2006 | Huang | ................ | H01S 3/0627 372/6 |
| 2006/0102377 A1 * | 5/2006 | Johnson | ................ | H01B 5/105 174/108 |
| 2006/0174658 A1 * | 8/2006 | Huang | ................ | H01S 3/06708 65/390 |
| 2008/0008438 A1 * | 1/2008 | Fukuda | ................ | C30B 15/08 385/142 |
| 2009/0158778 A1 * | 6/2009 | Peuchert | ................ | C03B 37/01211 65/435 |
| 2010/0229604 A1 * | 9/2010 | Huang | ................ | C03B 37/025 65/392 |
| 2011/0128611 A1 * | 6/2011 | Lin | ................ | G02B 6/0003 359/326 |

OTHER PUBLICATIONS

C. Y. Lo, K. Y. Huang, J. C. Chen, C. Y. Chuang, C. C. Lai, S. L. Huang, Y. S. Lin, and P. S. Yeh, "Double-clad Cr4+:YAG crystal fiber amplifier," Opt. Lett. 30, 129-131 (2005).*

Chien-Chih Lai, Hann-Jong Tsai, Kuang-Yao Huang, Kuang-Yu Hsu, Zhi-Wei Lin, Kuan-Dong Ji, Wen-Jun Zhuo, and Sheng-Lung Huang, "Cr4+:YAG double-clad crystal fiber laser," Opt. Lett. 33, 2919-2921 (2008).*

\* cited by examiner

MANUFACTURING METHOD OF DOUBLE CLADDING CRYSTAL FIBER

CROSS-REFERENCE TO RELATED APPLICATIONS

This non-provisional application claims priority claim under 35 U.S.C. §119(a) on Taiwan Patent Application No. 101133840 filed Sep. 14, 2012, and USPTO patent application Ser. No. 13/849,667 filed Mar. 25, 2013, currently pending, the entire contents of which are incorporated herein by reference.

FIELD OF THE INVENTION

The present invention is related to a double cladding crystal fiber, particularly to a double cladding crystal fiber structure applicable to high power fiber laser, high power fiber broadband light source or high power fiber amplifier.

BACKGROUND

The technologies of the commercial solid-state lasers are mostly bulk-optic. A bulk crystal doped with active doping ions is used as the gain medium. Considering pump absorption of the gain medium with a limited length in a laser cavity, a higher doping concentration is necessary. However, adverse effects including the thermal loading, quenching, and energy transfer up-conversion (ETU) arise when the doping concentration becomes higher. As a consequence the optical efficiency degrades.

In the prior art, such as U.S. Pat. No. 4,815,079, for example, a double cladding optical fiber for the high power optical fiber laser and amplifier applications using the cladding pump method is described. However, the double-clad optical fibers fabricated in accordance with prior art are all made of glass.

Furthermore, the single-crystal fibers are fabricated by means of Laser-Heated Pedestal Growth (LHPG) method or micro-pulling down method using bulk crystals as the source rods for the use of laser gain media. However, the diameter of a single-crystal fiber is pretty large, e.g., several hundreds of micrometers. Also the single-crystal fiber is un-clad so it is not suitable for high power fiber laser applications using the cladding pump method.

Further, regarding the propagation loss of inner cladding layer, in the prior art, such as U.S. Pat. No. 7,333,263 B2, a fabrication process of a double-clad crystal fiber is described therein, in which, however, the inner cladding layer is made of the mixture of crystal and glass, having numerous nanoscale crystalline particles therein, thus causing light scattering. Moreover, the doping ions in the nano particles are capable of absorbing pumping light, leading to the absorption loss of pumping light in the inner cladding region. Furthermore, this double cladding crystal fiber is, in general, merely suitable for lower power laser using the core-pumped configuration. If it is further used in high power laser of the cladding-pumped configuration, the nano particles in and the doping ions therein cause considerable scattering and absorption of pumping light, in such a way that the optical efficiency of this double cladding crystal fiber using cladding-pumped configuration is impaired significantly.

SUMMARY

It is one object of the present invention to provide a double cladding crystal fiber, which is a structure of fiber optic waveguide consisting of a core, an inner cladding and an outer cladding, the structure of the crystal fiber waveguide being used as gain medium for high power fiber laser, high power broadband fiber light source or high power fiber amplifier, so as to mitigate the impairment of optical efficiency caused by high power pump source effectively.

It is one object of the present invention to provide a double cladding crystal fiber, which is a structure of optical fiber suitable for cladding pumping, in such a way that pumping beam from a high power diode laser may be coupled to the inner cladding.

It is one object of the present invention to provide a double cladding crystal fiber, in which the inner cladding is made of a glass material, in which neither absorption nor scattering of pumping light produced by a high power laser occurs, such that the propagation loss of inner cladding layer is not affected.

It is one object of the present invention to provide a double cladding crystal fiber, in which the diameter of the core may be reduced to a minimum of 20 µm, so as to reduce the volume of structure of the optical fiber, but also further enhance the optical efficiency thereof.

It is one object of the present invention to provide a double cladding crystal fiber, the inner cladding of which is made of high refractive index glass having a refractive index similar to that of the crystal core, in such a way that number of guide modes of the optical fiber is reduced, so as to improve the output beam quality.

It is one object of the present invention to provide a manufacturing method of double cladding crystal fiber, in which the LHPG method is used for growing single crystal rod with a multiple-step diameter reduction process, so as to obtain a single crystal fiber with a smaller diameter.

It is one object of the present invention to provide a manufacturing method of double cladding crystal fiber, in which the co-drawing LHPG method is used to grow both the inner and outer claddings of the crystal fiber by means of heating them in one single step.

It is one object of the present invention to provide a manufacturing method of double cladding crystal fiber, in which LHPG method is used to grow inner cladding and outer cladding of the crystal fiber in turn by means of heating them in two steps.

To achieve above objects, the present invention provides a double cladding crystal fiber, comprising: a core made of the yttrium aluminum garnet (YAG) crystal or the sapphire crystal; an inner cladding, made of glass, enclosing over the outside of the core; and an outer cladding, made of glass, enclosing over the outside of the inner cladding.

In one embodiment of the present invention, wherein the refractive index of the core is higher than that of the inner cladding, while the refractive index of the inner cladding is higher than that of the outer cladding.

In one embodiment of the present invention, wherein the minimum possible diameter of the core is 20 µm.

In one embodiment of the present invention, wherein the crystal core is doped with at least one transition metal and/or at least one rare earth element.

In one embodiment of the present invention, wherein the transition metal is Titanium, Chromium, or Nickel.

In one embodiment of the present invention, wherein the rare earth element is Cerium, Praseodymium, Neodymium, Erbium, or Ytterbium.

In one embodiment of the present invention, wherein the inner cladding is made of a glass having a refractive index far lower than that of the crystal core, the glass being the aluminosilicate glass.

In one embodiment of the present invention, wherein the inner cladding is made of a glass having a high refractive index, the glass being an optical glass of model N-LaSF9, N-LaSF41, SF57, or N-SF57.

In one embodiment of the present invention, wherein the outer cladding is made of the borosilicate glass.

The present invention further provides a manufacturing method of a double cladding crystal fiber, comprising the steps of: providing an yttrium aluminum garnet (YAG) or a sapphire single crystal rod; growing the single crystal rod into a single crystal fiber having a predetermined diameter by means of the Laser-Heated Pedestal Growth (LHPG) method; providing a glass capillary for inner cladding, wherein the single crystal fiber is placed into the glass capillary for inner cladding; providing a glass capillary for outer cladding, wherein the single crystal fiber together with the glass capillary for inner cladding are placed into the glass capillary for outer cladding; and heating the glass capillary for inner cladding and the glass capillary for outer cladding by means of the LHPG method, in such a way that the glass capillary for inner cladding together with the glass capillary for outer cladding are softened and melted simultaneously to collapse onto the circumference of the single crystal fiber, and thus grown into a double cladding crystal fiber.

The present invention further provides an another manufacturing method of a double cladding crystal fiber, comprising the steps of: providing an yttrium aluminum garnet (YAG) or a sapphire single crystal rod; growing the single crystal rod into a single crystal fiber having a predetermined diameter by means of the Laser-Heated Pedestal Growth (LHPG) method; providing a glass capillary for inner cladding, wherein the single crystal fiber is placed into the glass capillary for inner cladding; heating the glass capillary for inner cladding by means of the LHPG method, in such a way that the glass capillary for inner cladding is softened and melted to collapse onto the circumference of the single crystal fiber, and thus grown into a single cladding crystal fiber; providing a glass capillary for outer cladding, wherein the single cladding crystal fiber is placed into the glass capillary for outer cladding; and heating the glass capillary for outer cladding by means of the LHPG method, in such a way that the glass capillary for outer cladding is softened and melted to collapse onto the circumference of the single cladding crystal fiber, and thus grown into a double cladding crystal fiber.

In one embodiment of the present invention, wherein the inner diameter of the glass capillary for inner cladding is larger than the outer diameter of the single crystal fiber, while the inner diameter of the glass capillary for outer cladding is larger than the outer diameter of the glass capillary for inner cladding.

In one embodiment of the present invention, wherein the growth process of the single crystal fiber having a predetermined diameter from the crystal rod comprises multiple diameter reduction growth steps.

In one embodiment of the present invention, wherein the minimum possible diameter of the single crystal fiber is 20 μm.

In one embodiment of the present invention, wherein the glass capillary for inner cladding is made of aluminosilicate glass.

In one embodiment of the present invention, wherein the glass capillary for inner cladding is made of a glass having a high refractive index, the glass being an optical glass of model N-LaSF9, N-LaSF41, SF57 or N-SF57.

In one embodiment of the present invention, wherein the glass capillary for outer cladding is made of borosilicate glass.

DETAILED DESCRIPTION OF THE PREFERRED EMBODIMENTS

Figure 1:
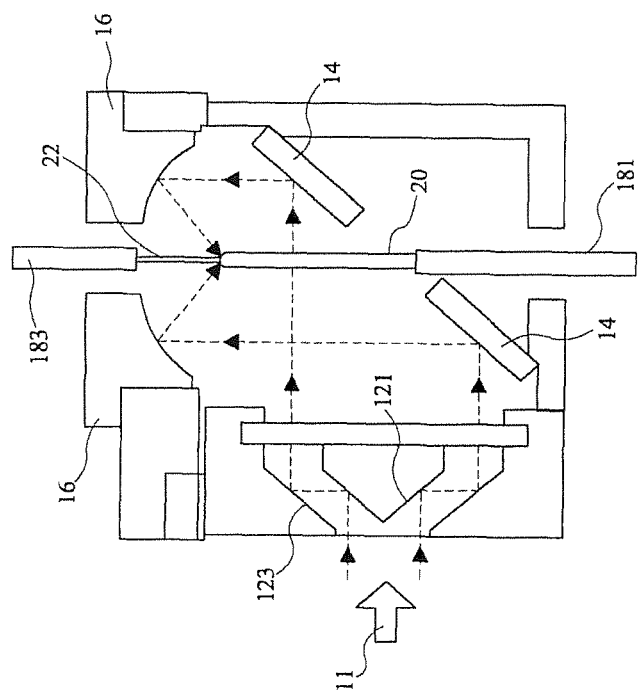
FIG. 1 is a diagram showing the structure of fabricating a crystal fiber using the Laser-Heated Pedestal Growth (LHPG) method according to one preferred embodiment of the present invention.
Figure 2:
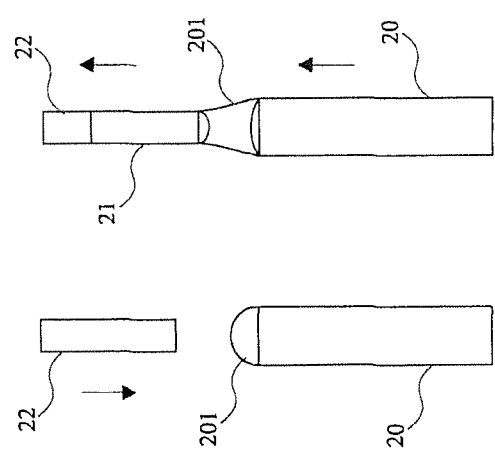
FIG. 2 is a diagram showing the growth procedure of a single crystal fiber according to one preferred embodiment of the present invention.

Referring to FIGS. 1 and 2, there are shown diagrams illustrating the structure of the growth chamber for fabricating a crystal fiber using the Laser-Heated Pedestal Growth (LHPG) method and the growth procedure of a single crystal fiber, respectively, according to one preferred embodiment of the present invention. The crystal fiber of the present invention is fabricated by the LHPG method. The material for manufacturing a crystal fiber is mainly an yttrium aluminum garnet (YAG) crystal or a sapphire crystal.

As illustrated in FIG. 1, the fabrication of crystal fiber is carried out in a laser-heated device 10. Firstly, a first fixture 181 is used to clamp an YAG or a sapphire single crystal source rod 20, and a second fixture 183 is used to clamp a seed crystal 22.

An expanded laser beam 11 generated from $CO_2$ laser is directed into the laser-heated device 10, and the collimated light beam may be then converted into a ring light beam via a first conic mirror 121 and a second conic mirror 123. Subsequently, the ring light beam may be in turn reflected upward onto a parabolic mirror 16 via a reflective mirror 14, and then focused on the end face of the single crystal source rod 20.

As illustrated in FIG. 2, the end face of the single crystal source rod 20 is heated by the CO2 laser beam to form a molten zone 201. Then the seed crystal 22 moves downward to contact with the molten zone 201 of the source rod and then pulled up slowly, while the single crystal source rod 20 is pushed up. Thus, a single crystal fiber 21 with the same crystal orientation as that of seed crystal 22 may be grown. Various ratios of diameter reduction may be achieved by the use of various speed ratios between the growth speed of the seed crystal 22 and the feeding speed of the single crystal source rod 20. For instance, if the speed ratio between the growth speed of seed crystal 22 and the feeding speed of single crystal source rod 20 is 16:1, the diameter ratio between the single crystal fiber 21 and the single crystal source rod 20 is then 1:4.

With the limitation on the size reduction ratio of the grown crystal fiber in one single-step growth process, in one preferred embodiment of the present invention, the single crystal fiber 21 with a desired small diameter and also a good quality may be grown using the multiple-step growth process of LHPG method. For instance, a 500 μm×500 μm single crystal square rod is cut from a crystal block, and then grown into a single crystal fiber 21 having a diameter of 250 μm by means of LHPG method, followed by a subsequent growth with diameter reduction, using LHPG method again, which results in a single crystal fiber 21 having a diameter of 80 μm with a diameter reduction ratio of 9.8, and in turn by a further growth with diameter reduction, using the LHPG method again, which results in a single crystal fiber 21 having a diameter of 20 μm with a diameter reduction ratio of 16. As such, the single crystal fiber 21 is grown into a crystal fiber having a predetermined diameter with a multiple-step diameter reduction process.

Figure 3B:
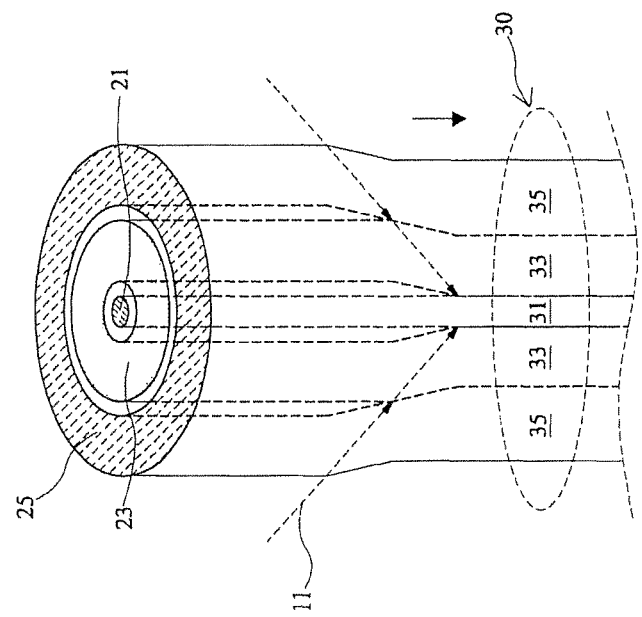
FIGS. 3A to 3B are structural diagrams showing a fabrication process of a double cladding crystal fiber according to one embodiment of the present invention, respectively.
Figure 3A:
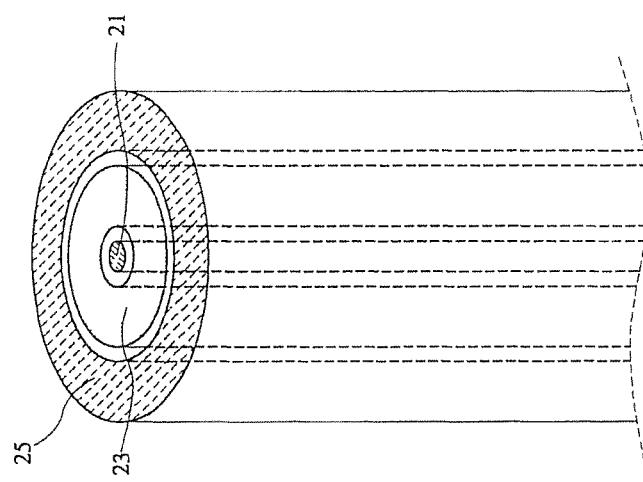

Referring to FIGS. 3A and 3B, there are shown structural diagrams of a double cladding crystal fiber illustrating a fabrication process according to one embodiment of the present invention, respectively. As illustrated in FIG. 3A, a single crystal fiber 21 is firstly placed into a glass capillary for inner cladding 23. Afterwards, the single crystal fiber 21 together with the glass capillary for inner cladding 23 are placed in unison into a glass capillary for outer cladding 25. In this case, the inner diameter at the tube wall of the glass capillary for inner cladding 23 may be larger than the diameter of the single crystal fiber 21, while the inner diameter at the tube wall of the glass capillary for outer cladding 25 may be larger than an outer diameter of the glass capillary for inner cladding 23.

Subsequently, as illustrated in FIG. 3B, the glass capillary for outer cladding 25 including the single crystal fiber 21 and the glass capillary for inner cladding 23 therein is placed into a laser-heated device 10. When the LHPG method is used, a laser beam 11 may be focused on the glass capillary for outer cladding 25 and absorbed within a shallow depth, in such a way that the glass capillary for outer cladding 25 may be heated and become softened and melted by the laser beam 11 so as to attach to the outside of the glass capillary for inner cladding 23. Secondly, heating power provided by the laser beam 11 absorbed by the glass capillary for outer cladding 25 may be conducted further to the glass capillary for inner cladding 23, in such a way that the glass capillary for inner cladding 23 is also softened and melted subsequently so as to attached to the outside of the single crystal fiber 21.

The single crystal fiber 21, glass capillary for inner cladding 23 and glass capillary for outer cladding 25 synchronously, slowly, and continuously moved and pass through the focal point of the focal point of the CO2 laser heating source in the laser-heated device 10 (such as, in a downward direction, for example), and all sections of glass capillary for outer cladding 25 and glass capillary for inner cladding 23 are then heated and scanned by the laser beam 11 in succession to soften and melt to attach to the outsides of glass capillary for inner cladding 23 and single crystal fiber 21, respectively, and thus grown into a double cladding crystal fiber 30. In this connection, the single crystal fiber 21 may become the core 31 of the double cladding crystal fiber 30, the softened and melted glass capillary for inner cladding 23 may become the inner cladding 33 of the double cladding crystal fiber 30, and the softened and melted glass capillary for outer cladding 25 may become the outer cladding 35 of the double cladding crystal fiber 30.

In one embodiment of the present invention, the core 31 is made of an optical crystal, normally having a considerably high refractive index, such as yttrium aluminum garnet (YAG) or sapphire crystal, for example. The inner cladding 33 is made of a glass, having a refractive index normally far lower than that of the optical crystal, such as aluminosilicate, for example. Moreover, the outer cladding 35 is made of another kind of glass, having a refractive index even lower than that of the inner cladding, such as borosilicate, for example. In the double cladding crystal fiber 30, thus, the refractive index of the core 31 is higher than that of the inner cladding 33, such that the core 31 is allowed to guide light, while the refractive index of the inner cladding 33 is higher than that of the outer cladding 35, such that the inner cladding 33 is also allowed to guide light.

Alternatively, in another embodiment of the present invention, the inner cladding 33 is additionally fabricated by glass, having a high refractive index close to that of the YAG crystal core 31, such as the optical glass with model N-LaSF9, N-LaSF41, SF57 or N-SF57, for example. The number of guided modes of the fiber 30 may be then reduced, when glass, having a refractive index close to that of the crystal core 31, is used for fabricating the inner cladding 33. In this connection, it is preferable to form a crystal fiber structure of one single mode, thereby, improving beam quality of output light.

Further, crystal material (such as, YAG crystal or sapphire crystal, for example) used for the fabrication of core 31 is doped with ions including at least one transition metal and/or at least one rare earth element. Transition metal includes Titanium (Ti), Chromium (Cr) or Nickel (Ni), while rare earth element includes Cerium (Ce), Praseodymium (Pr), Neodymium (Nd), Erbium (Er) or Ytterbium (Yb). Preferably, doping concentration of ions in crystal of the core 31 of the present invention is lower than 1%.

As mentioned above, the merits of the double cladding crystal fiber 30 provided by the present invention are listed as follows:

(1) In the present invention, optical crystal is manufactured into the optical fiber, in such a way that the length of gain medium may be increased by means of structure of fiber optic waveguide. Then, thermal problem caused by high power light source may be mitigated effectively when the present invention is applied to high power laser, high power wide band light source or high power amplifier.

(2) The diameter of core 31 may be reduced to a minimum of 20 μm, thus enhancing optical efficiency of the double cladding crystal fiber 30.

(3) The double cladding crystal fiber 30 of the present invention is suitable for cladding-pimped configuration, in which the inner cladding 33 of larger size is suitable for coupling with the high power pumping laser having a larger active region, in such a way that pumping light from high power laser is easy to focus on the inner cladding 33 so as to be optically guided in the inner cladding 33. Furthermore, neither absorption nor scattering of pumping light may occur, such that propagation loss in the inner cladding layer for the pumping light is not resulted since the inner cladding 33 is made of glass.

Referring to FIGS. 4A to 4D, there are shown structural diagrams of a double cladding crystal fiber illustrating a fabrication process according to another embodiment of the present invention, respectively. Compared with the inner cladding 33 and the outer cladding 35 of the crystal fiber 30 grown simultaneously by means of heating them in one single step in the above fabrication process, the inner cladding 33 and the outer cladding 35 of the crystal fiber 30 are grown by means of heating them in two separate steps in the fabrication process of the present embodiment.

Figure 4B:
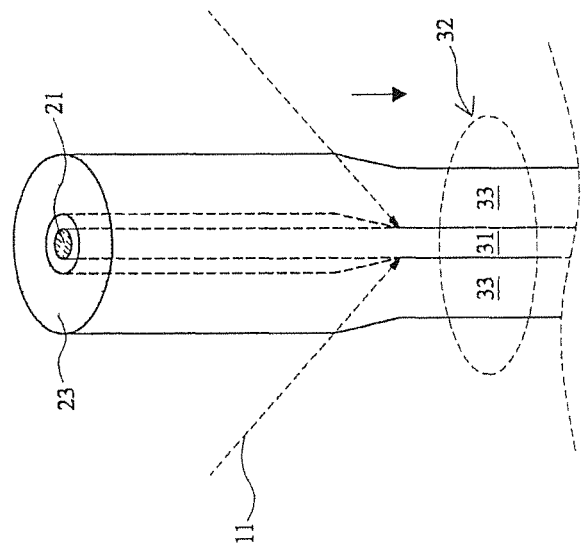
FIGS. 4A to 4D are structural diagrams showing a fabrication process of a double cladding crystal fiber according to another embodiment of the present invention, respectively.
Figure 4A:
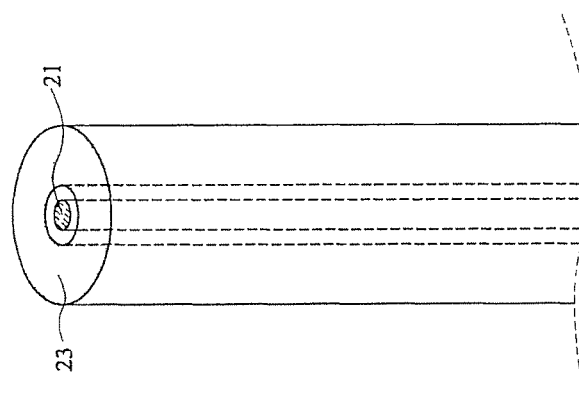

As illustrated in FIG. 4A, a single crystal fiber 21 is placed into a glass capillary for inner cladding 23. As illustrated in FIG. 4B, When LHPG method is used, the laser beam 11 may be focused on the glass capillary for inner cladding 23 and absorbed within a shallow depth, in such a way that the glass capillary for inner cladding 23 may be heated and become softened and melted by the laser beam 11 so as to attach to the outside of the single crystal fiber 21, and thus grown into a single cladding crystal fiber 32.

Figure 4D:
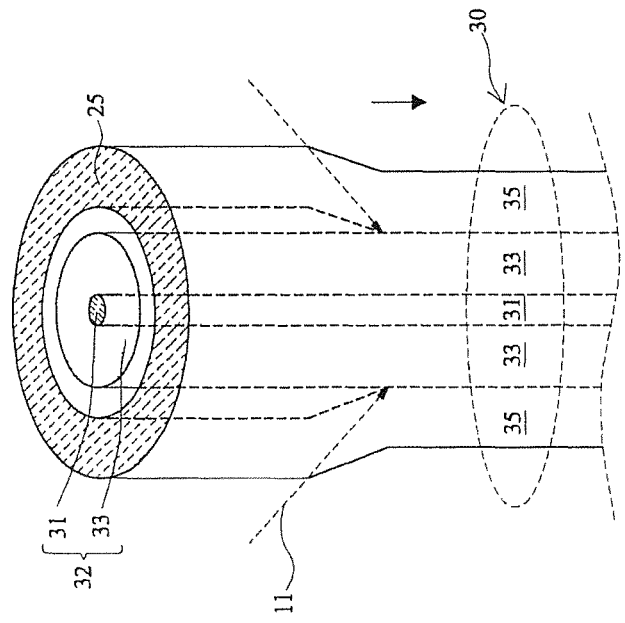
Figure 4C:
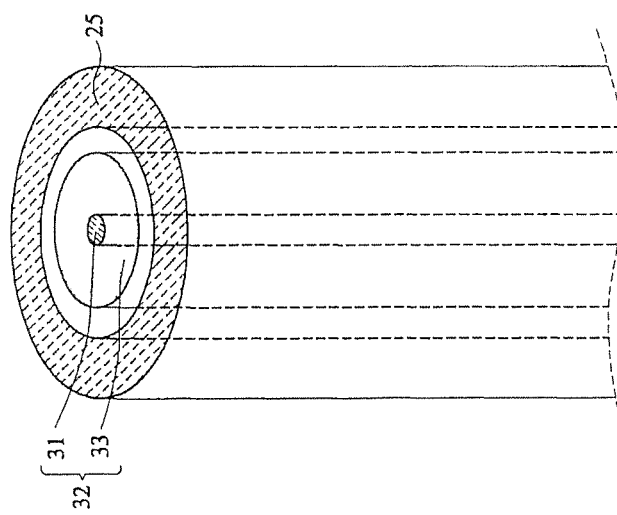

As illustrated in FIG. 4C, the single cladding crystal fiber 32 is placed into the glass capillary for outer cladding 25. As illustrated in FIG. 4D, When LHPG method is used again, the laser beam 11 may be focused on the glass capillary for outer cladding 25 and absorbed within a shallow depth, in such a way that the glass capillary for outer cladding 25 may be heated and become softened and melted by the laser beam 11 so as to attach to the outside of the single cladding crystal fiber 32, and thus grown into a double cladding crystal fiber 30.

Figure 5A:
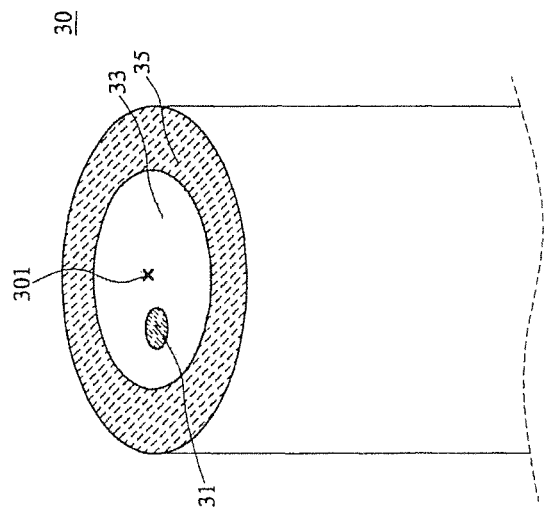
FIG. 5A is a structural cross-section view showing the end face of the double cladding crystal fiber according to one embodiment of the present invention.
Figure 5B:
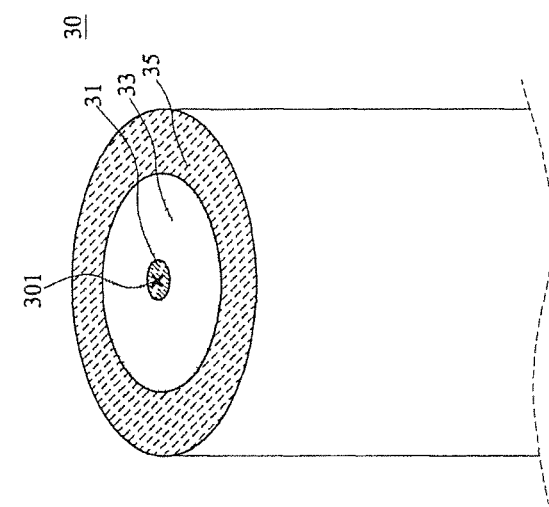
FIG. 5B is a structural cross-section view showing the end face of the double cladding crystal fiber according to another embodiment of the present invention.

Furthermore, in one embodiment of the present invention, the core 31 may be located in a center 301 of the inner cladding 33, as illustrated in FIG. 5A. Alternatively, in another embodiment of the present invention, the core 31 may be deviated from the center 301 of the inner cladding 33, so as to enhance the absorption of the core 31 with respect to the pumping light guided in the inner cladding, as illustrated in FIG. 5B.

Figure 6:
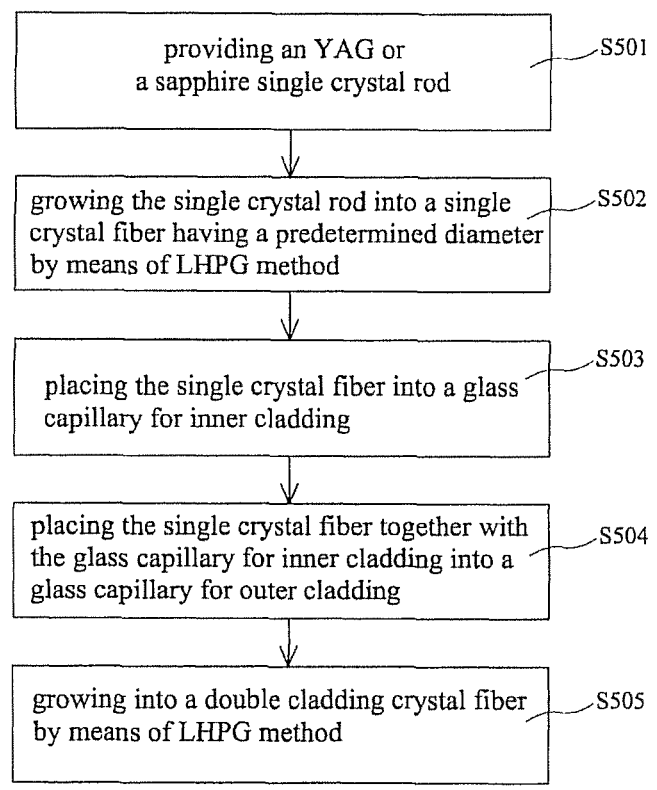
FIG. 6 is a flow chart illustrating a fabrication process of a double cladding crystal fiber according to one embodiment of the present invention.

Referring to FIG. 6, there is shown a flow chart illustrating a manufacturing method of a double cladding crystal fiber according to one embodiment of the present invention. Firstly, a YAG or a sapphire single crystal rod 20 is provided, as shown in step S501. The single crystal rod 20 is grown with a multiple-step diameter reduction process by means of the LHPG method, and thus grown into a single crystal fiber 21 having a predetermined diameter, such as a minimum possible diameter of the single crystal fiber 21 of 20 µm, for example, as shown in step S502.

The single crystal fiber 21 is placed into a glass capillary for inner cladding 23, as shown in step S503. Afterwards, the single crystal fiber 21 together with the glass capillary for inner cladding 23 are placed into a glass capillary for outer cladding 25 in unison, as shown in step S504. Finally, the LHPG method is used to heat up both the glass capillary for inner cladding 23 and the glass capillary for outer cladding 25, in such a way that the glass capillary for outer cladding 25 is softened and melted to attach to the outside of the glass capillary for inner cladding 23 while the glass capillary for inner cladding 23 is softened and melted to attach to the outside of the crystal fiber 21, thus a double cladding crystal fiber 30 is grown, as illustrated in step S505.

Figure 7:
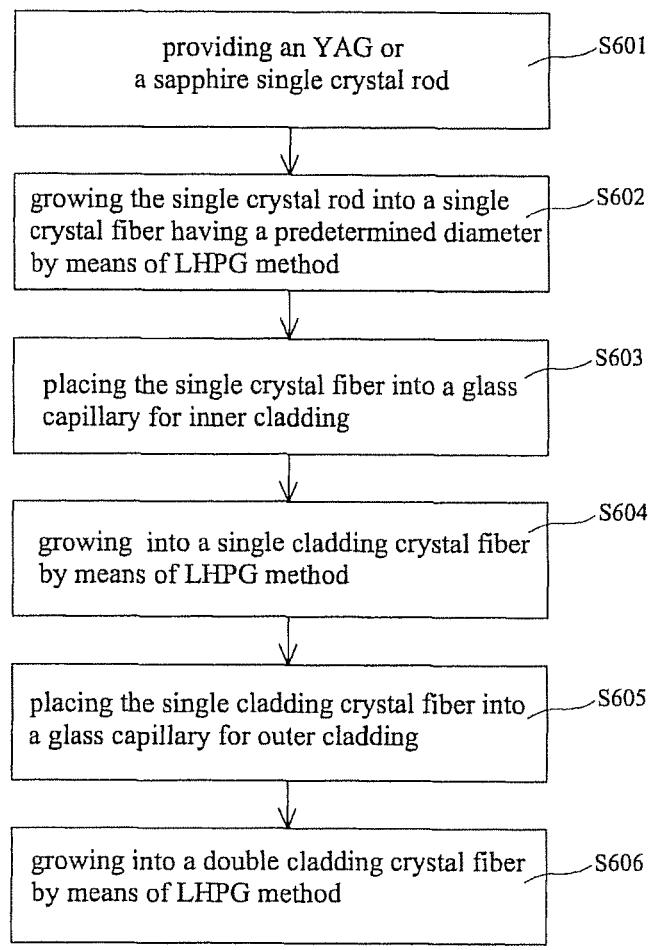
FIG. 7 is a flow chart illustrating a fabrication process of a double cladding crystal fiber according to another embodiment of the present invention.

Referring to FIG. 7, there is shown a flow chart illustrating a manufacturing method of a double cladding crystal fiber according to another embodiment of the present invention. Firstly, a YAG or a sapphire single crystal rod 20 is provided, as shown in step S601. The single crystal rod 20 is grown with a multiple-step diameter reduction process by means of LHPG method, and thus grown into a single crystal fiber 21 having a predetermined diameter, such as a minimum possible diameter of the single crystal fiber 21 may be 20 µm, for example, as shown in step S602.

The single crystal fiber 21 is placed into a glass capillary for inner cladding 23, as shown in step S603, Afterwards, the glass capillary for inner cladding 23 is heated by the LHPG method, in such a way that the glass capillary for inner cladding 23 may be softened and melted so as to attach to the outside of single crystal fiber 21, and thus grown into a single cladding crystal fiber 32, as shown in step S604.

The single cladding crystal fiber 32 is placed into a glass capillary for outer cladding 25, as shown in step S605. The glass capillary for outer cladding 25 is heated by LHPG method again, in such a way that the glass capillary for outer cladding 25 may be softened and melted so as to enclose over the outside of single cladding crystal fiber 32, and thus grown into a double cladding crystal fiber 30, as shown in step S606.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A manufacturing method of a double cladding crystal fiber, comprising the steps of:
   providing a yttrium aluminum garnet (YAG) or a sapphire single crystal rod;
   growing said single crystal rod into a single crystal fiber having a predetermined diameter by means of the Laser-Heated Pedestal Growth (LHPG) method;
   providing a glass capillary for inner cladding, wherein said single crystal fiber is placed into said glass capillary for inner cladding;
   providing a glass capillary for outer cladding, wherein said single crystal fiber together with said glass capillary for inner cladding are placed into said glass capillary for outer cladding in unison; and
   heating said glass capillary for inner cladding and said glass capillary for outer cladding simultaneously by means of the LHPG method, in such a way that said glass capillary for inner cladding together with said glass capillary for outer cladding are softened and melted simultaneously to attach to the outside of said single crystal fiber, and thus grown into a double cladding crystal fiber wherein said glass capillary for inner cladding is made of a glass having higher refractive index than one of said glass capillary for outer cladding.

2. The manufacturing method according to claim 1, wherein the inner diameter of said glass capillary for inner cladding is larger than the outer diameter of said single crystal fiber, while the inner diameter of said glass capillary for outer cladding is larger than the outer diameter of said glass capillary for inner cladding.

3. The manufacturing method according to claim 1, wherein the growth process of said single crystal fiber having a predetermined diameter from said crystal rod comprises multiple diameter reduction growth steps.

4. The manufacturing method according to claim 1, wherein a minimum possible diameter of said single crystal fiber is 20 µm.

5. The manufacturing method according to claim 1, wherein said glass capillary for inner cladding is made of aluminosilicate glass.

6. The manufacturing method according to claim 1, wherein said glass capillary for inner cladding is made of an optical glass of model N-LaSF9, N-LaSF41, SF57, or N-SF57.

7. The manufacturing method according to claim 1, wherein said glass capillary for outer cladding is made of borosilicate glass.

8. A manufacturing method of a double cladding crystal fiber, comprising the steps of:
- providing a yttrium aluminum garnet (YAG) or a sapphire single crystal rod;
- growing said single crystal rod into a single crystal fiber having a predetermined diameter by means of the Laser-Heated Pedestal Growth (LHPG) method;
- providing a glass capillary for inner cladding, wherein said single crystal fiber is placed into said glass capillary for inner cladding;
- heating said glass capillary for inner cladding by means of the LHPG method, in such a way that said glass capillary for inner cladding is softened and melted to attach to the outside of said single crystal fiber, and thus grown into a single cladding crystal fiber;
- providing a glass capillary for outer cladding, wherein said single cladding crystal fiber is placed into said glass capillary for outer cladding; and
- heating said glass capillary for outer cladding by means of LHPG method, in such a way that said glass capillary for outer cladding is softened and melted to attach to the outside of said single cladding crystal fiber, and thus grown into a double cladding crystal fiber wherein said glass capillary for inner cladding is made of a glass having higher refractive index than one of said glass capillary for outer cladding.

9. The manufacturing method according to claim 8, wherein the inner diameter of said glass capillary for inner cladding is larger than the outer diameter of said single crystal fiber, while the inner diameter of said glass capillary for outer cladding is larger than the outer diameter of said glass capillary for inner cladding.

10. The manufacturing method according to claim 8, wherein the growth process of said single crystal fiber having a predetermined diameter from said crystal rod comprises multiple diameter reduction growth steps.

11. The manufacturing method according to claim 8, wherein a minimum possible diameter of said single crystal fiber is 20 μm.

12. The manufacturing method according to claim 8, wherein said glass capillary for inner cladding is made of aluminosilicate glass.

13. The manufacturing method according to claim 8, wherein said glass capillary for inner cladding is made of an optical glass of model N-LaSF9, N-LaSF41, SF57, or N-SF57.

14. The manufacturing method according to claim 8, wherein said glass capillary for outer cladding is made of borosilicate glass.

\* \* \* \* \*